(12) United States Patent
Seki et al.

(10) Patent No.: US 6,848,498 B2
(45) Date of Patent: Feb. 1, 2005

(54) TEMPERATURE CONTROL APPARATUS

(75) Inventors: Masanobu Seki, Hiratsuka (JP); Mineo Tokuda, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 1 day.

(21) Appl. No.: 09/923,413

(22) Filed: Aug. 8, 2001

(65) Prior Publication Data

US 2002/0020697 A1 Feb. 21, 2002

(30) Foreign Application Priority Data

Aug. 11, 2000 (JP) .................................. 2000-243604

(51) Int. Cl.[7] ............................. F28F 7/00; F28D 15/00
(52) U.S. Cl. ................. 165/80.1; 165/80.5; 165/104.11
(58) Field of Search ....................... 165/79, 80.1, 80.5, 165/200, 81, 47, 104.11

(56) References Cited

U.S. PATENT DOCUMENTS

| | | | | |
|---|---|---|---|---|
| 3,324,942 A | * | 6/1967 | Miller | 165/81 X |
| 3,974,022 A | * | 8/1976 | Lauro | 165/81 X |
| 4,317,483 A | * | 3/1982 | Denis | 165/81 |
| 4,328,860 A | * | 5/1982 | Hoffmuller | 165/81 |
| 4,825,937 A | * | 5/1989 | Kertzman | 165/200 |

OTHER PUBLICATIONS

"BN70 Nitrile BUNA–N 70", O–Rings, Inc., http://www.oringsusa.com/my_html/buy_bn70.html, 9/10/200490.*

* cited by examiner

Primary Examiner—Ljiljana Ciric
(74) Attorney, Agent, or Firm—Varndell & Varndell, PLLC

(57) ABSTRACT

A temperature control apparatus where it is easy to replace a heat exchange unit to enhance the maintainability and the space efficiency and which can absorb the thermal expansion/shrinkage of a heat exchanger is provided. The temperature control apparatus has a heat exchanger 11 with a passage 31 for passing a fluid; a connecting pipe 21 connected to the passage of the heat exchanger; a passage block 16 with a passage for passing the fluid to the heat exchanger; a relay block 15 for forming a passage between the passage of the passage block and the connecting pipe; and sealing means 14 for connecting the connecting pipe movably to the passage of the relay block. In the temperature control apparatus, the length of the connecting pipe 21 is made substantially equal to or slightly shorter than the spacing between the heat exchanger 11 and the passage block 16.

3 Claims, 5 Drawing Sheets

TEMPERATURE CONTROL APPARATUS

BACKGROUND OF THE INVENTION

1. Field of the Invention

The present invention relates to a temperature control apparatus for controlling the temperature of another apparatus and, more particularly, to a temperature control apparatus for cooling a semiconductor manufacturing apparatus such as an etching apparatus by exchanging the heat between a heat exchanger for passing a liquid (or a temperature controlling fluid) fed from the outside and a heat exchanger for passing a circulating liquid (or a temperature controlled fluid) and by using this circulating liquid.

2. Related Art

The temperature control apparatus of the prior art, as used for cooling a semiconductor manufacturing apparatus such as an etching apparatus, is provided with a heat exchanger unit 30, as shown in FIG. 3. This heat exchanger unit 30 includes: a cooling water heat exchanger (or a temperature controlling heat exchanger) having a cooling water passage 31 formed for passing the cooling water fed from the outside; and a circulating liquid heat exchanger (or a temperature controlled heat exchanger) having a (not-shown) circulating liquid passage formed for passing a circulating liquid to be circulated between itself and the etching apparatus, so that the heat is exchanged between the cooling water heat exchanger and the circulating liquid heat exchanger. The cooling water passage 31 is connected through a joint 33 to a pipe 36 connected to the outside. For this connection, there are used two nuts 34 and 35 which are attached to the joint 33.

In this temperature control apparatus of the prior art, however, a space is needed for turning the nuts 34 and 35 so that there is a problem that the space efficiency is poor. Where the heat exchange unit 30 is arranged in a narrow space, on the other hand, the nuts 34 and 35 are hard to be turned thereby raise another problem that the maintainability is poor. Moreover, the heat exchanger is fixed at its two ends to raise another problem that the thermal distortion in the heat exchanger cannot be absorbed.

On the other hand, it is conceivable to connect a connecting pipe to a cooling water passage and to connect the connecting pipe to a passage block by fitting it and further to the pipe 36 through a passage block. With this construction, however, the passage block and the heat exchange unit have to be precisely machined and that leads to rise in cost.

Alternatively, it is conceivable to attach the connecting pipe to the passage block removably by means of bolts. With this construction, however, it is impossible to absorb the distortion of the heat exchanger, as caused by the thermal expansion or shrinkage.

SUMMARY OF THE INVENTION

In view of the discussion thus far described, therefore, the present invention has an object to provide a temperature control apparatus having the structure which is easy in the replacement of a heat exchange unit to enhance the maintainability and the space efficiency and which can absorb the distortion of a heat exchanger due to the thermal expansion or shrinkage.

In order to solve the above-specified problems, according to a first aspect of the invention, there is provided a temperature control apparatus which comprises: a temperature controlling heat exchanger having a passage for passing a temperature controlling fluid; a connecting pipe connected to the passage of the temperature controlling heat exchanger; a passage block having a passage for passing a temperature controlling fluid to the temperature controlling heat exchanger; a relay block for forming a passage between the passage of the passage block and the connecting pipe; and sealing means for connecting the connecting pipe movably to the passage of the relay block. In the temperature control apparatus, the length of the connecting pipe is made substantially equal to or slightly shorter than the spacing between the temperature controlling heat exchanger and the first block.

According to a second aspect of the invention, on the other hand, there is provided a temperature control apparatus which comprises: a temperature controlled heat exchanger having a passage for passing a temperature controlled fluid; a connecting pipe connected to the passage of the temperature controlled heat exchanger; a passage block having a passage for passing a temperature controlled fluid to the temperature controlled heat exchanger; a relay block for forming a passage between the passage of the passage block and the connecting pipe; and sealing means for connecting the connecting pipe movably to the passage of the relay block. In the temperature control apparatus, the length of the connecting pipe is made substantially equal to or slightly shorter than the spacing between the temperature controlled heat exchanger and the first block.

According to a third aspect of the invention, on the other hand, there is provided a temperature control apparatus which comprises a heat exchange unit for exchanging the heat between a temperature controlling heat exchanger having a passage for passing a temperature controlling fluid and a temperature controlled heat exchanger having a passage for passing a temperature controlled fluid. The temperature control apparatus has both the features of the temperature control apparatus according to the first aspect and the features of the temperature control apparatus according to the second aspect.

According to the invention, the relay block has the passage between the passage block and the connecting pipe of the heat exchange unit, and the length of the connecting pipe is substantially equal to or slightly shorter than the spacing between the heat exchanger and the passage block. Where the heat exchange unit is troubled, therefore, the troubled heat exchange unit can be easily replaced by a new one by removing the relay block connected to the troubled heat exchange unit from the passage block. On the other hand, the connecting pipe of the heat exchange unit is connected to the passage of the relay block by using the sealing means that mentioned above so that the distortion of the heat exchanger due to the thermal expansion or shrinkage can be absorbed.

BRIEF DESCRIPTION OF THE DRAWINGS

FIG. 2A is a top plan view of one column of the heat exchange unit, and FIG. 2B is a side elevation of one column of the heat exchange unit;

DESCRIPTION OF THE PREFERRED EMBODIMENT

Here will be described an embodiment of the invention with reference to the accompanying drawings.

Figure 1:
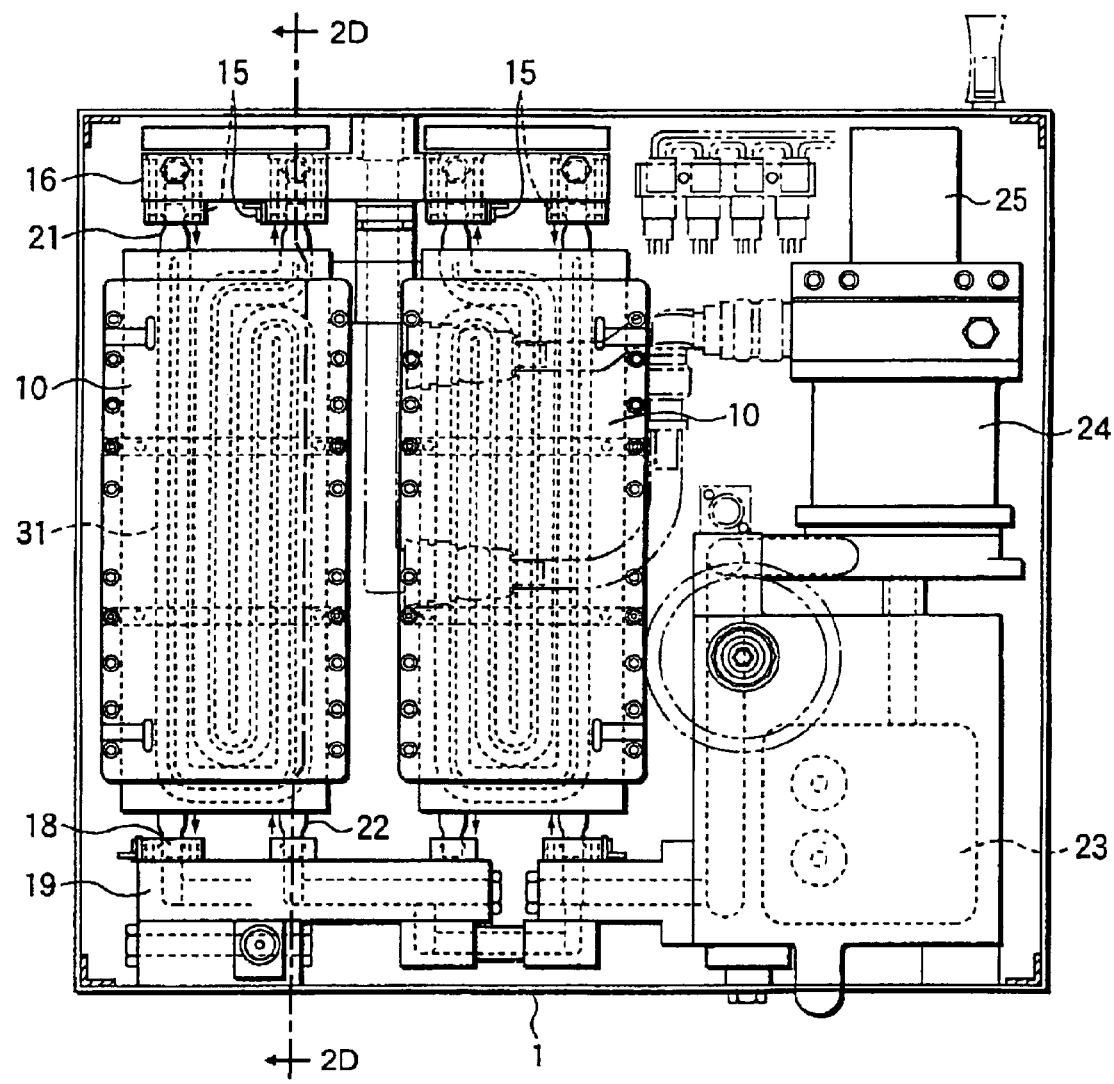
FIG. 1 is a top plan view showing the interior of a temperature control apparatus related to one embodiment of the invention.

FIG. 1 is a top plan view showing a temperature control apparatus according to one embodiment of the invention. In this embodiment, the invention is applied to a temperature control apparatus for cooling an etching apparatus. As shown in FIG. 1, this temperature control apparatus is provided with heat exchange units 10 which are arrayed in two columns in the horizontal direction. The heat exchange unit 10 is so removably attached to a casing 1 of the temperature control apparatus that it can be replaced, when troubled, by a new one.

Figure 2A:
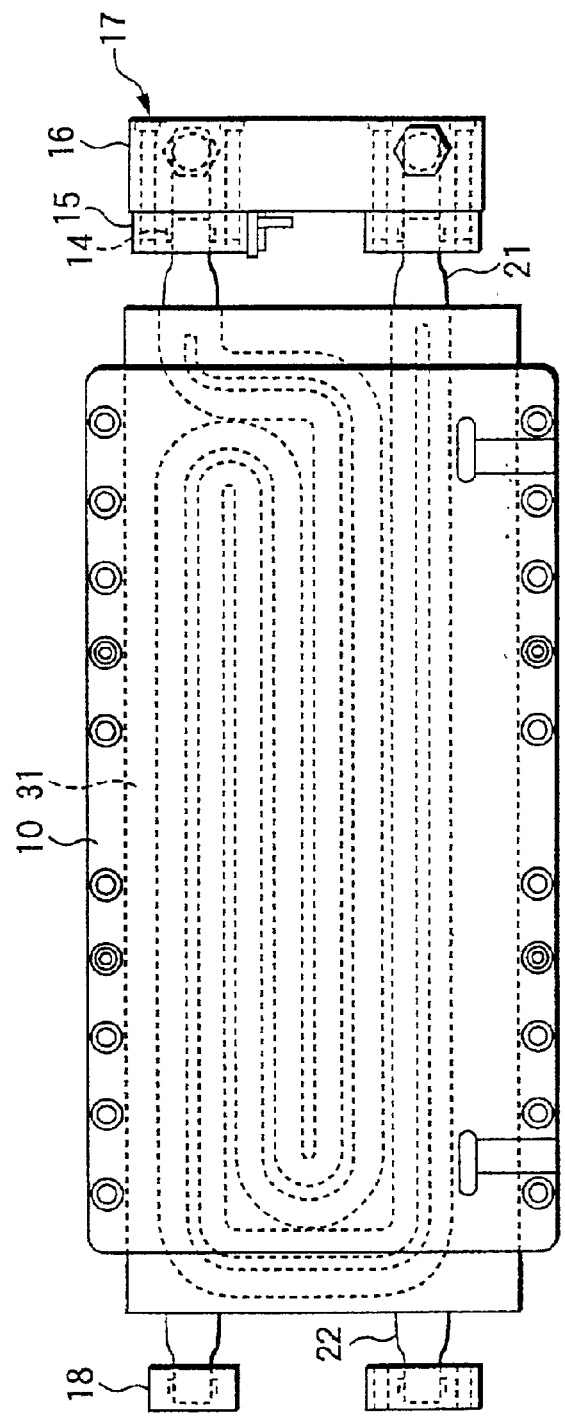
FIGS. 2A and 2B are views showing the construction of a heat exchange unit of FIG. 1 in details.
Figure 2B:
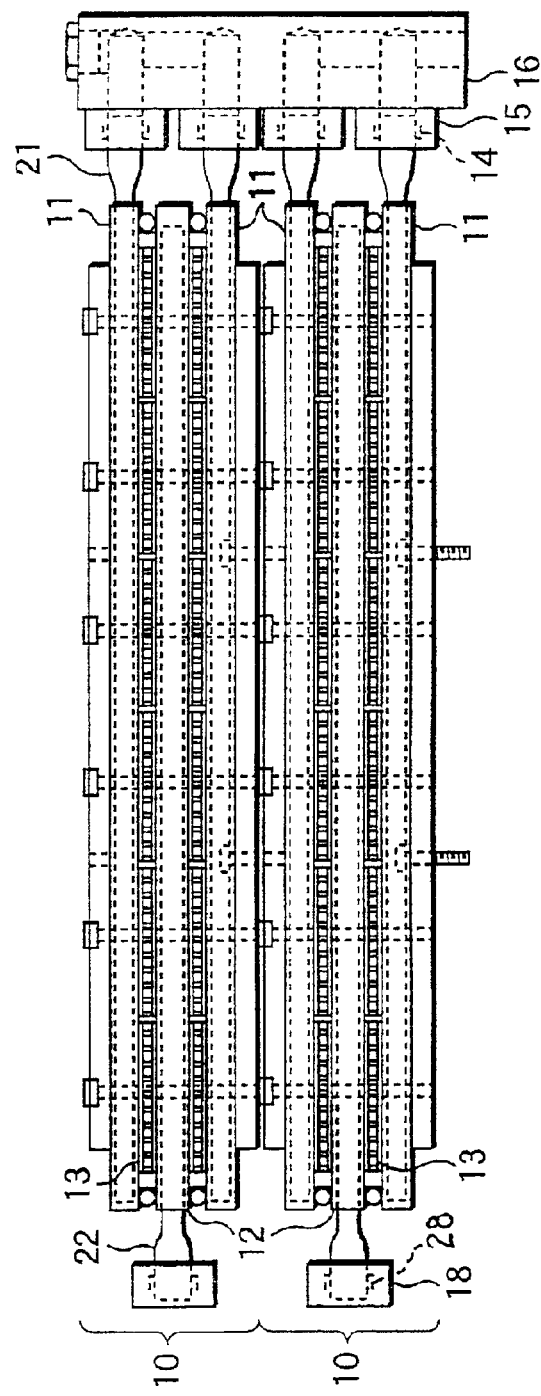

FIGS. 2A and 2B are showing the construction of this heat exchange unit in detail. FIG. 2A is a top plan view of one column of the heat exchange unit, and FIG. 2B is a side elevation of one column of the heat exchange unit. As shown in FIG. 2B, the heat exchange units 10 are vertically stacked at two steps so that totally four heat exchange units are disposed in the temperature control apparatus. Here, these heat exchange units may be arrayed at four steps either in the vertical direction or in the horizontal direction.

In one heat exchange unit 10, a cooling water heat exchanger (or a temperature controlling heat exchanger) 11 having a cooling water passage 31 formed for passing the cooling water fed from the outside and a circulating liquid heat exchanger (or a temperature controlled heat exchanger) 12 having a (not-shown) circulating liquid passage formed for passing a circulating liquid to be circulated between itself and the etching apparatus are alternately stacked vertically through thermoelectric modules 13, so that a heat is exchanged between the cooling water heat exchanger 11 and the circulating liquid heat exchanger 12. Here, this embodiment provides the two cooling water heat exchangers 11 above and below one cooling water heat exchanger 12.

When an electric current is fed to the thermoelectric module 13, the heat migrates from the circulating liquid heat exchanger 12 to the cooling water heat exchanger 11. As a result, the circulating liquid flowing in the circulating liquid passage is cooled down so that the heat is drained to the cooling water flowing in the cooling water passage. The cooling water may be always renewed by new one or may be circulated with the outside.

To each of the inlet port and the outlet port of the cooling water passage of the cooling water heat exchanger 11, there is connected each connecting pipe 21. Each connecting pipe 21 is connected to one relay block 15 in a watertight manner by using a sealing member 14 conventionally used with heat exchangers, such as an O-ring or other elastic sealing member. By using such a sealing member, it is possible to absorb the distortion that is caused by the thermal expansion or shrinkage of the heat exchanger. In addition, the connecting pipe 21 is tapered in the vicinity of its inlet or outlet port to prevent the heat exchange unit 10 from moving more than a set amount. The tapered structure of the connecting pipe 21 may be replaced by a stopper for preventing the heat exchange unit 10 from moving more than a set amount.

As shown in FIG. 2B, the eight connecting pipes 21, as connected to the four cooling water heat exchangers 11 of the two heat exchange units 10, are individually connected to the eight relay blocks 15. Moreover, these eight relay blocks 15 are fixed to one cooling water passage block 16 which is fixed in the casing 1. As shown in FIG. 1, the relay blocks 15, while connected to the other two heat exchange units, are also fixed to the same cooling water passage block 16. Here, the length of the connecting pipe 21 is made substantially equal to or slightly shorter than the spacing between the cooling water heat exchanger 11 and the cooling water passage block 16. In addition, the length of the connecting pipe 21 is longer than the spacing between the heat exchanger 11 and the relay blocks 15 plus the width of the sealing member 14. When the heat exchange unit needs replacement, therefore, a defective heat exchange unit can be easily replaced by a new one by removing the relay block 15 connected to the defective heat exchange unit from the cooling water passage block 16. The connecting pipes 22, heat exchanger 12, passage block 19, relay blocks 18, and sealing member 28, have the same structure and arrangement with the resulting same function. Namely, the length of the connecting pipe 22 is made substantially equal to or slightly shorter than the spacing between the circulating liquid heat exchanger 12 and the cooling water passage block 19. In addition, the length of the connecting pipe 22 is longer than the spacing between the heat exchanger 12 and the relay blocks 18 plus the width of the sealing member 28.

Figure 2C:
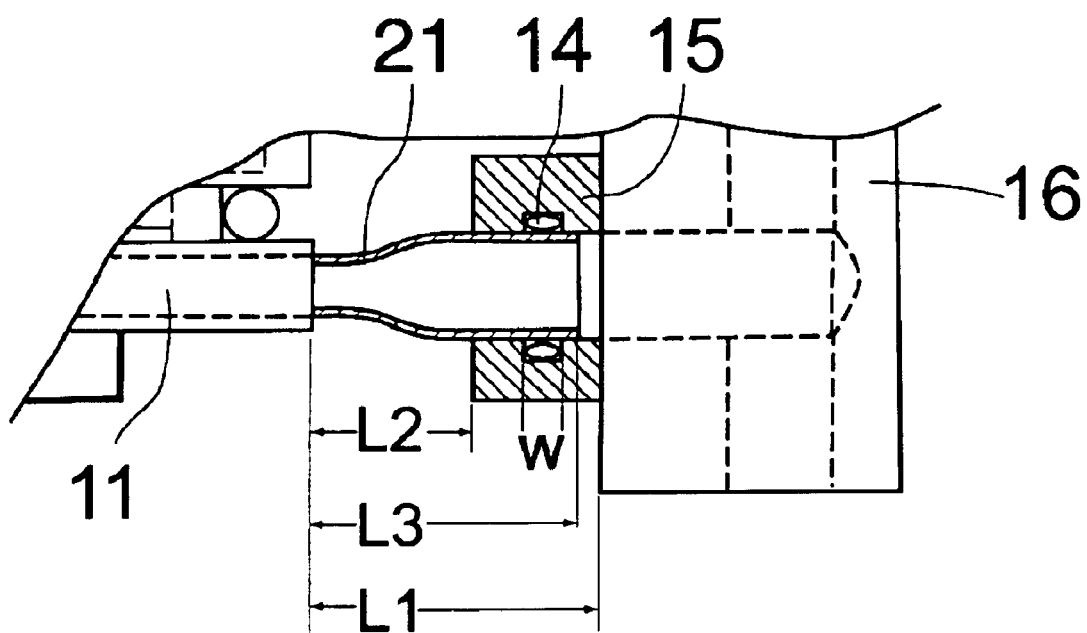
FIG. 2C is a partial cross sectional view of the bottom right-hand portion of the heat-exchange unit shown in FIG. 2B.

Attention is respectfully directed to FIG. 2C. In this figure, the relay block (or second block) 15 is cut away to show the connecting pipe 21 and the sealing member 14. FIG. 2C identifies lengths L1, L2, and L3 and width W. L1 is the distance from the first block 16 to the temperature controlling heat-exchanger 11. L2 is the distance from the relay block 15 to the temperature controlling heat-exchanger 11. L3 is the length of the connecting pipe 21. W is the width of the sealing member. These lengths and width have the following relationship (L2+W)<L3≦L1. In other words, the length of the connecting pipe L3 is less than or equal to the first distance (L1) between the first block 16 and the temperature controlling heat-exchanger 11; and the length of the connecting pipe L3 is greater than the sum of (1) the distance L2 between the relay block 15 and the temperature controlling heat-exchanger 11 (L2) and (2) the width of the sealing member (W).

Figure 2D:
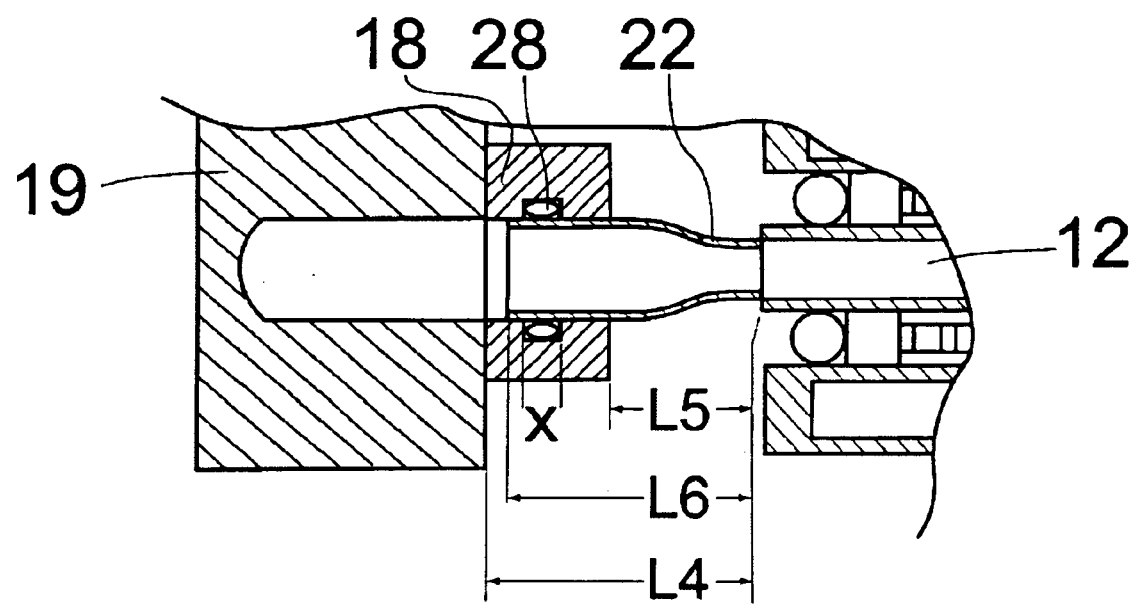
FIG. 2D is a partial cross sectional view of the bottom left-hand portion of the heat-exchange unit shown in FIG. 2B taken along line 2D—2D of FIG. 1.
Figure 3:
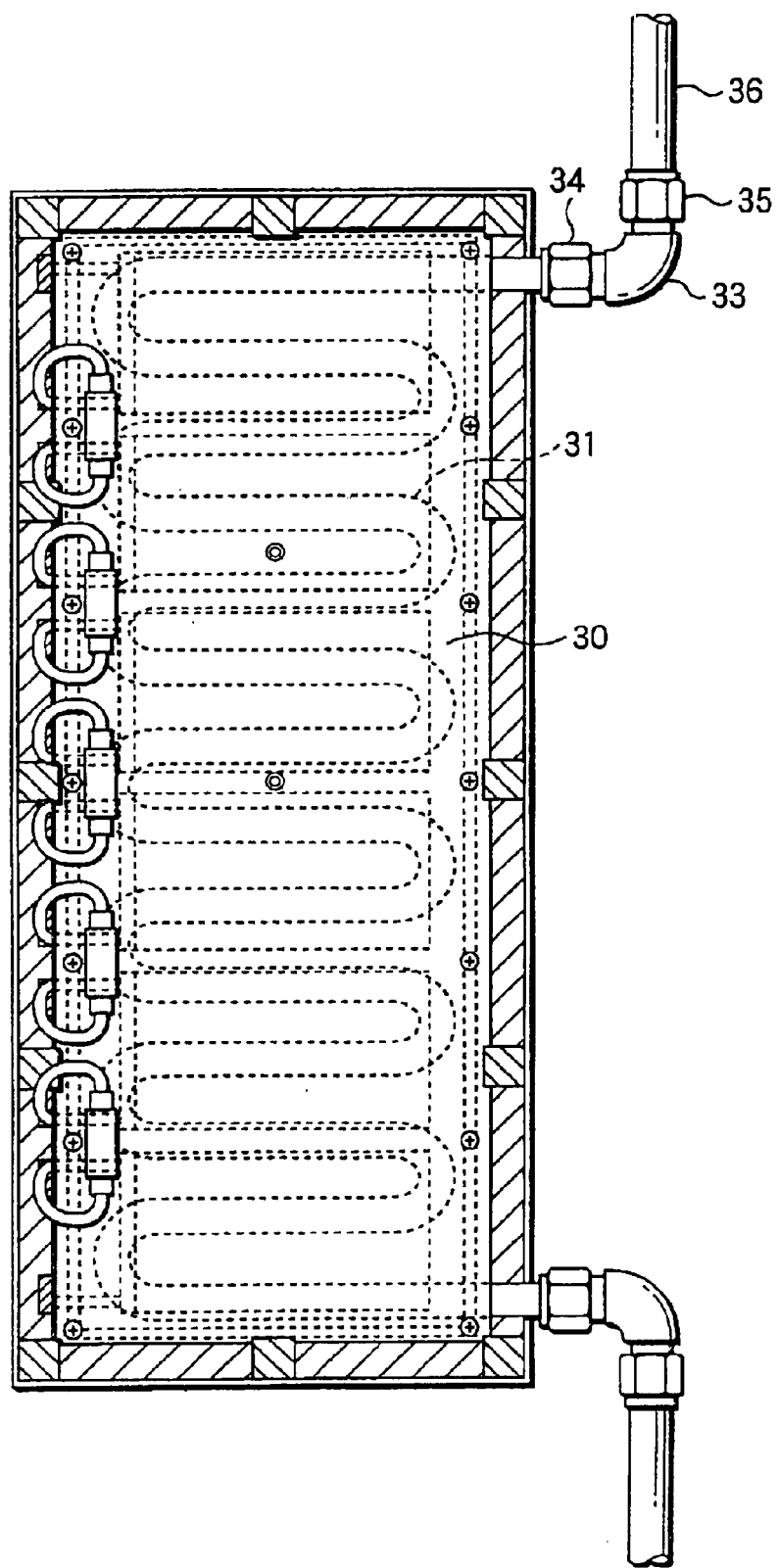
FIG. 3 is a top plan view showing a portion of the temperature control apparatus of the prior art.

Attention is respectfully directed to FIG. 2D. In this figure, the first block (circulating passage block) 19 is cut away. The relay block (or second block) 18 is also cut away to show the connecting pipe 22 and the sealing member 28. FIG. 2D identifies lengths L4, L5, and L6 and width X. L4 is the distance from the first block 19 to the temperature controlled heat-exchanger 12. L5 is the distance from the relay block 18 to the temperature controlled heat-exchanger 12. L6 is the length of the connecting Pipe 22. X is the width of the sealing member. These lengths and width have the following relationship (L5+X)<L6≦L4. In other words, the length of the connecting pipe L6 is less than or equal to the first distance (L4) between the first block 19 and the temperature controlled heat-exchanger 12; and the length of the connecting pipe L6 is greater than the sum of (1) the distance L5 between the relay block 18 and the temperature controlled heat-exchanger 13 (L5) and (2) the width of the sealing member (X).

In order to fix the relay block 15 and the cooling water passage block 16, for example, a bolt 17 shown in FIG. 2A is used as the fixing member. The bolt 17 is inserted into a hole formed in the cooling water passage block 16 and is fastened to the relay block 15. If the bolt 17 can be thus turned from the outside of the casing, the replacement of the heat exchange unit can be further facilitated. If the inside diameter of the hole formed in the cooling water passage block 16 is made larger than the diameter of the bolt 17, on the other hand, it is possible to absorb the dimension errors in those blocks or heat exchange units.

On the other hand, the circulating liquid heat exchanger 12 is also connected to a relay block 18 same as in the case of the cooling water heat exchanger 11. As shown in FIG. 1, a plurality of relay blocks 18 are fixed to one circulating liquid passage block 19. In the temperature control apparatus, moreover, there are arranged a tank 23 for reserving the circulating liquid, a pump 24 for circulating the circulating liquid, and a motor 25 for driving the pump 24. Moreover, a tank 23 for reserving the circulating liquid, a pump 24 for circulating the circulating liquid, and a motor 25 for driving the pump 24 are arranged in the temperature control apparatus.

According to the present invention, as apparent from the description mentioned above, the connecting pipe of the heat exchange unit is connected to the plurality of relay blocks, which are fixed to the passage block, and the length of the connecting pipe is substantially equal to or slightly shorter than the spacing between the heat exchanger and the passage block so that the heat exchange unit can be replaced by removing the relay block from the passage block. Therefore, the heat exchange unit can be easily replaced to enhance the maintainability and the space efficiency. On the other hand, the connecting pipe of the heat exchange unit is movably connected to the passage of the relay block by using the sealing means such as the O-ring so that the distortion due to the thermal expansion or shrinkage of the heat exchanger can be absorbed.

In the present invention the expression "the length of the connecting pipe is substantially equal to or slightly shorter than the spacing between the heat exchanger and the passage block," as used in this application, means that the connecting pipe (21, 22) has a length relative to the distance between the edges of the respective heat exchanger (11, 12) and respective passage block (16, 19), which length is from 80% of the distance up to 105% of the distance between the edges of the heat exchanger (11, 12) and the respective passage block (16, 19) as these items are shown in FIGS. 1 and 2B and elsewhere in the present specification disclosure. In addition, the expression "the length of the connecting pipe (21, 22) is longer than the spacing between the respective heat exchanger (11, 12) and the respective relay blocks (15, 18) plus the width of the respective sealing member (14, 28)," as used in this application, means that the length of the connecting pipe (21, 22) is greater than the sum of the distance between the edges of the respective heat exchanger (11, 12) and the respective relay block (15, 18) added to the width of the respective sealing member (14, 28), as these items are shown in FIGS. 1 and 2B and elsewhere in the present specification disclosure.

What is claimed is:

1. A temperature control apparatus comprising:
   a temperature controlling heat exchanger having passages for passing a temperature controlling fluid;
   connecting pipes respectively connected to said passages of said temperature controlling heat exchanger;
   a first block having passages for passing a temperature controlling fluid to said temperature controlling heat exchanger, said first block being arranged at a first distance from said temperature controlling heat-exchanger;
   a second block forming passages between said passages of said first block and said connecting pipes, said second block being arranged at a second distance from said temperature controlling heat-exchanger; and
   sealing members respectively movably connecting said connecting pipes to said passages of said second block, each of said sealing members having a width;
   said connecting pipes respectively having a length substantially equal to or shorter than said first distance, and said length of said connecting pipes being longer than a sum of said second distance and said width of a respective sealing member.

2. A temperature control apparatus comprising:
   a temperature controlled heat exchanger having passages for passing a temperature controlled fluid;
   connecting pipes respectively connected to said passages of said temperature controlled heat exchanger;
   a first block having passages for passing a temperature controlled fluid to said temperature controlled heat exchanger, said first block being arranged at a first distance from said temperature controlled heat-exchanger;
   a second block forming passages between said passages of said first block and said connecting pipes, said second block being arranged at a second distance from said temperature controlled heat-exchanger; and
   sealing members respectively movably connecting said connecting pipes to said passages of said second block, each of said sealing members having a width;
   said connecting pipes having a length substantially equal to or shorter than said first distance, and said length of said connecting pipes being longer than a sum of said second distance and said width of a respective sealing member.

3. A temperature control apparatus comprising:
   a heat exchange unit for exchanging heat between a temperature controlling heat exchanger having passages for passing a temperature controlling fluid and a temperature controlled heat exchanger having passages for passing a temperature controlled fluid;
   first connecting pipes connected to said passages of said temperature controlling heat exchanger;
   a first block having passages for passing a temperature controlling fluid to said temperature controlling heat exchanger, said first block being arranged at a first distance from said temperature controlling heat-exchanger;
   a second block forming passages between said passages of said first block and said first connecting pipes, said second block being arranged at a second distance from said temperature controlling heat-exchanger;
   first sealing members movably respectively connecting said first connecting pipes to said passages of said second block, each of said first sealing members having a first width;
   second connecting pipes connected to said passages of said temperature controlled heat exchanger;
   a third block having passages for passing said temperature controlled fluid to said temperature controlled heat exchanger, said third block being arranged at a third distance from said temperature controlled heat-exchanger;
   a fourth block forming passages between said passages of said third block and said second connecting pipes, said fourth block being arranged at a fourth distance from said temperature controlling heat-exchanger; and second sealing members respectively movably connecting said second connecting pipes to said passages of said fourth block, each of said second sealing members having a second width;

said first connecting pipes having a length substantially equal to or shorter than said first distance, and said length of said first connecting pipes being longer than a sum of said second distance and said first width of a respective first sealing member, and said second connecting pipes having a length substantially equal to or shorter than said third distance, and said length of said second connecting pipes being longer than a sum of said fourth and said second width of a respective second sealing member.

* * * * *